US012761543B2

(12) United States Patent
Lee et al.

(10) Patent No.: US 12,761,543 B2
(45) Date of Patent: Oct. 13, 2026

(54) BLANK MASK AND PHOTOMASK USING THE SAME

(71) Applicant: LuminaMask Co., Ltd., Cheonan-si (KR)

(72) Inventors: GeonGon Lee, Seoul (KR); Seong Yoon Kim, Seoul (KR); Min Gyo Jeong, Seoul (KR); Hyung Joo Lee, Seoul (KR); Sung Hoon Son, Seoul (KR); Tae Young Kim, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 568 days.

(21) Appl. No.: 18/451,607

(22) Filed: Aug. 17, 2023

(65) Prior Publication Data

US 2024/0061324 A1 Feb. 22, 2024

(30) Foreign Application Priority Data

Aug. 18, 2022 (KR) ........................ 10-2022-0103470

(51) Int. Cl.
*G03F 1/32* (2012.01)
*G03F 1/48* (2012.01)

(52) U.S. Cl.
CPC . *G03F 1/32* (2013.01); *G03F 1/48* (2013.01)

(58) Field of Classification Search
CPC ..... G03F 1/32; G03F 1/48; G03F 1/26; G03F 1/50
USPC ............................................................... 430/5
See application file for complete search history.

(56) References Cited

U.S. PATENT DOCUMENTS

2006/0160034 A1* 7/2006 Wurm .................... B82Y 40/00 430/330
2010/0084375 A1* 4/2010 Hosoya ..................... G03F 1/24 216/24
2022/0179304 A1* 6/2022 Nakamura ................ G03F 1/60
2023/0097280 A1 3/2023 Nozawa et al.

FOREIGN PATENT DOCUMENTS

JP 2003-262946 A 9/2003
JP 2006-184353 A 7/2006
JP 4587806 B2 9/2010
JP 5141504 B2 11/2012
JP 2019-20749 A 2/2019
JP 6876737 B2 4/2021

(Continued)

*Primary Examiner* — Caleen O Sullivan
(74) *Attorney, Agent, or Firm* — NSIP Law

(57) ABSTRACT

A blank mask includes a light transmissive substrate and a multilayer comprising a light shielding layer and a phase shift layer disposed between the light transmissive substrate and the light shielding layer. The phase shift layer includes an upper surface facing the light shielding layer and a side surface connected to the upper surface, such that the light shielding layer is disposed on the upper surface and the side surface of the phase shift layer. When viewed from a top surface of the multilayer, the multilayer includes a central portion and an outer portion surrounding the central portion. The outer portion has a curved upper surface, which greatly suppresses damage to the phase shift layer by a cleaning solution and effectively reduces a frequency of particle generation at edges of the phase shift layer and the light shielding layer.

11 Claims, 5 Drawing Sheets

(56) References Cited

FOREIGN PATENT DOCUMENTS

| | | | |
|---|---|---|---|
| JP | 2021-148968 | A | 9/2021 |
| JP | 2022-024295 | A | 2/2022 |
| JP | 2023-122806 | A | 9/2023 |
| KR | 10-1079759 | B1 | 10/2011 |
| KR | 10-2017-0021192 | A | 2/2017 |
| KR | 10-2020-0121044 | A | 10/2020 |
| KR | 10-2377406 | B1 | 3/2022 |
| TW | 201523122 | A | 6/2015 |
| WO | WO 2014/021235 | A1 | 2/2014 |

* cited by examiner

BLANK MASK AND PHOTOMASK USING THE SAME

CROSS-REFERENCE TO RELATED APPLICATION

This application claims the benefit under 35 USC § 119(a) of Korean Patent Application No. 10-2022-0103470, filed on Aug. 18, 2022, the entire disclosure of which is incorporated herein by reference for all purposes.

BACKGROUND

1. Field

The following description relates to a blank mask and a photomask using the same.

2. Discussion of Related Art

Higher integration of semiconductor devices is demanding finer circuit patterns, which is why lithography, a technology that uses photomasks to form circuit patterns on the surface of wafers, is becoming increasingly important.

In order to develop microcircuit patterns, a light source used in the lithography process must have a short wavelength. Recently, an ArF excimer laser with a wavelength of 193 nm has been used as the lithography light source.

Meanwhile, photomasks include a binary mask and a phase shift mask.

The binary mask has a configuration in which a pattern of shielding layers is formed on a light-transmitting substrate. On the surface of the patterned binary mask, a transmissive portion that does not include a light shielding layer transmits the exposure light, and a blocking portion that includes the light shielding layer blocks the exposure light so that a pattern is developed on the resist film on the surface of the wafer. However, as the pattern becomes finer, the binary mask may have problems developing fine patterns due to diffraction of light from the edges of the transmissive portion during the exposure process.

Phase shift masks include Levenson-type phase shift masks, outrigger-type phase shift masks, and half-tone type phase shift masks. Among the phase shift masks, the half-tone type phase shift mask has a configuration in which a pattern is formed with a semi-transmissive layer on a light-transmissive substrate. On the surface of the patterned half-tone type phase shift mask, a transmissive portion that does not include the semi-transmissive layer transmits the exposure light, and a semi-transmissive portion that does include the semi-transmissive layer transmits the attenuated exposure light.

The attenuated exposure light has a phase difference compared to the exposure light passing through the transmissive portion. Thus, since diffracted light generated at the edges of the transmissive portion is offset by the exposure light passing through the semi-transmissive portion, the phase shift mask may form a more elaborate fine pattern on the surface of the wafer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a blank mask includes a light transmissive substrate, and a multilayer comprising a light shielding layer and a phase shift layer disposed between the light transmissive substrate and the light shielding layer.

The phase shift layer includes an upper surface facing the light shielding layer and a side surface connected to the upper surface, such that the light shielding layer is disposed on the upper surface and the side surface of the phase shift layer.

When viewed from a top surface of the multilayer, the multilayer includes a central portion and an outer portion surrounding the central portion. The outer portion has a curved upper surface.

The light transmissive substrate may include an upper surface facing the phase shift layer, and the light shielding layer may be disposed on at least a portion of the upper surface of the light transmissive substrate.

The light transmissive substrate may further include a side surface connected to the upper surface of the light transmissive substrate. The side surface of the light transmissive substrate may include a first surface bent to extend from the upper surface of the light transmissive substrate, and a second surface extending from the first surface in a vertical direction of the blank mask, and the light shielding layer may be disposed on at least a portion of the first surface of the light transmissive substrate.

When viewed from the top surface of the multilayer, an area A of the light transmissive substrate, an area B of the light shielding layer, and an area C of the phase shift layer may satisfy the following Equation 1:

$$A \geq B > C \quad \text{[Equation 1]}$$

The outer portion of the multilayer may include a slope area in which a thickness of the multilayer may increase from an edge of the multilayer in an inward direction of the multilayer.

The slope area may be disposed in an outermost portion of the multilayer and in a cross-sectional view of the multilayer, the slope area may have a width ranging from 0.2 mm to 1.0 mm in an in-plane direction of the multilayer.

Among dT values according to Equation 2 measured from the multilayer, a maximum value may range from 10 nm to 30 nm:

$$dT = T1 - T2 \quad \text{[Equation 2]}$$

In Equation 2, T1 may denote a thickness of the multilayer measured at a first point located in the multilayer, and T2 may denote a thickness of the multilayer measured at a second point located 0.1 mm apart from the first point in a direction of one edge of the multilayer.

Among ddT values according to Equation 3 measured from the multilayer, a maximum value may be 30 nm or less:

$$ddT = |(T1 - T2) - (T2 - T3)|, \text{ and} \quad \text{[Equation 3]}$$

in Equation 3, T1 may denote a thickness of the multilayer measured at a first point positioned in the multilayer, T2 may denote a thickness of the multilayer measured at a second point located 0.1 mm apart from the first point in a direction of one edge of the multilayer, and T3 may denote a thickness of the multilayer measured at a third point located 0.1 mm apart from the second point in the direction of the one edge of the multilayer.

The multilayer may include a lower surface in contact with the light transmissive substrate; the phase shift layer may include a lower surface in contact with the light transmissive substrate; in a cross-sectional view of the multilayer, the lower surface of the multilayer may include a first edge which is one end, and a second edge which is the other end positioned opposite to the first edge, and the lower surface of the phase shift layer may include a third edge which is one end positioned adjacent to the first edge, and a fourth edge which is the other end positioned adjacent to the second edge, and a smaller value of a distance value between the first edge and the third edge and a distance value between the second edge and the fourth edge may be 0.1 nm or more.

In another aspect, a photomask may be made from the blank mask set forth above.

In another aspect, a method of manufacturing a semiconductor device may include preparing a light source, a photomask, and a semiconductor wafer on which a resist layer are applied, selectively transmitting and emitting a light incident from the light source through the photomask to the semiconductor wafer, and developing a photoresist pattern formed on the semiconductor wafer, wherein the photomask is made from the blank mask set forth above.

Figure 1:
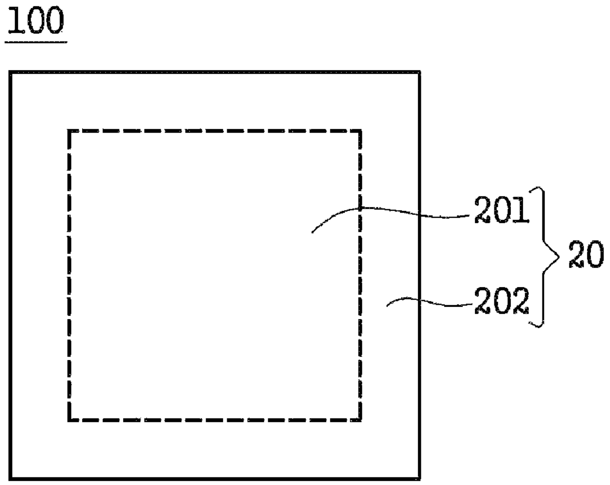
FIG. 1 is a plan view illustrating a blank mask according to one or more embodiments of the present disclosure.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

In the present specification, "surrounding" is construed as a meaning including both contacting and surrounding an object to be surrounded and surrounding an object to be surrounded without contact.

In order to remove contaminants remaining on a manufactured blank mask, the blank mask may be cleaned. As a cleaning solution applied in the blank mask cleaning process, a solution with relatively high chemical reactivity is often employed. Among thin-film layers included in the blank mask, a phase shift layer has relatively poor chemical resistance compared to other thin-film layers. In particular, a side surface of the phase shift layer is directly exposed to the cleaning solution during the cleaning process and may be easily damaged during the cleaning process.

Incidentally, there is a problem in that particles are continuously generated over time in the cleaned blank mask. This is believed to be due to the formation of particles derived from the phase shift layer damaged by the cleaning solution during storage and transportation of the blank mask, or because many particles are formed when the light shielding layer is damaged by impact or oxidation. In particular, the corners of the light shielding layer are considered vulnerable to external impact.

The inventors of the embodiments have experimentally confirmed that the phase shift layer can be stably protected from the cleaning solution and formation of particles derived from the phase shift layer and the light shielding layer can be effectively suppressed by applying a structure covering an upper surface and a side surface of the phase shift layer to the light shielding layer, and making the outer portion of the light shielding layer have a curved upper surface.

Hereinafter, one or embodiments of the present disclosure will be described in detail.

Shape and Structure of Multilayer

Figure 2A:
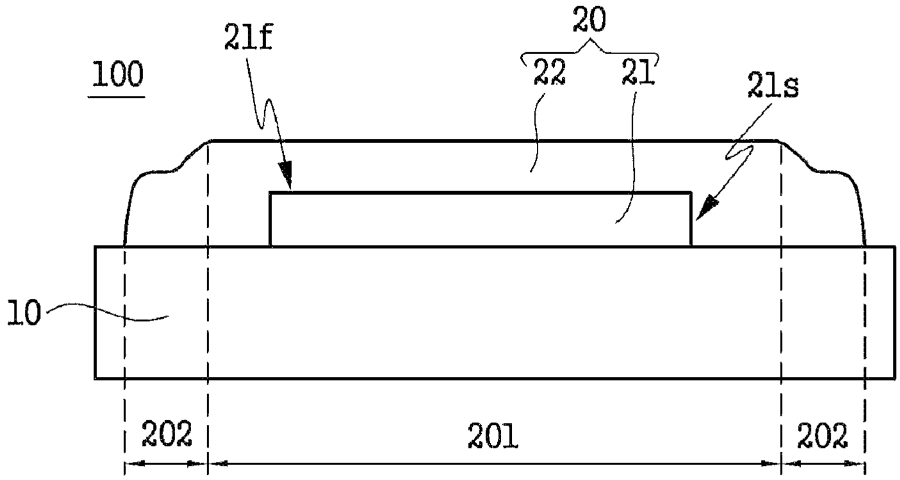
FIGS. 2A, 2B, and 2C illustrate conceptual diagrams for describing an outer portion of a multilayer.
Figure 2B:
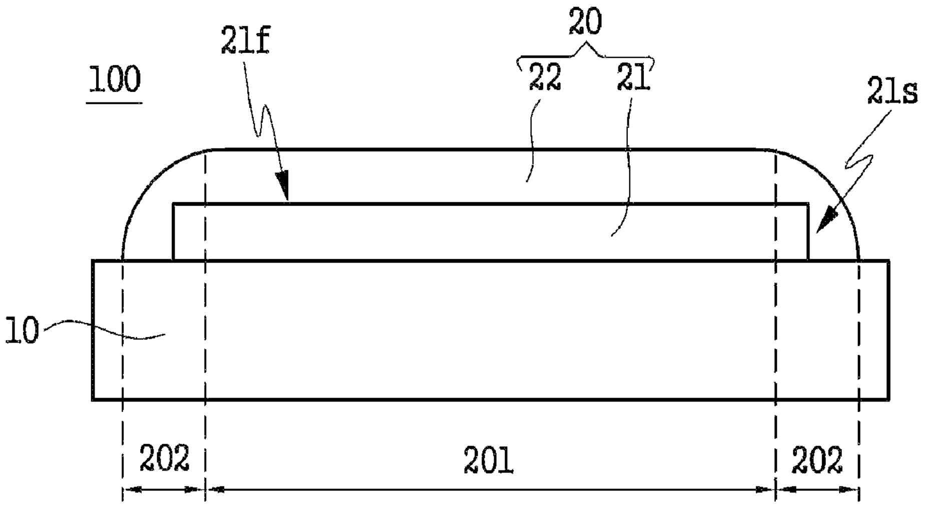
Figure 2C:
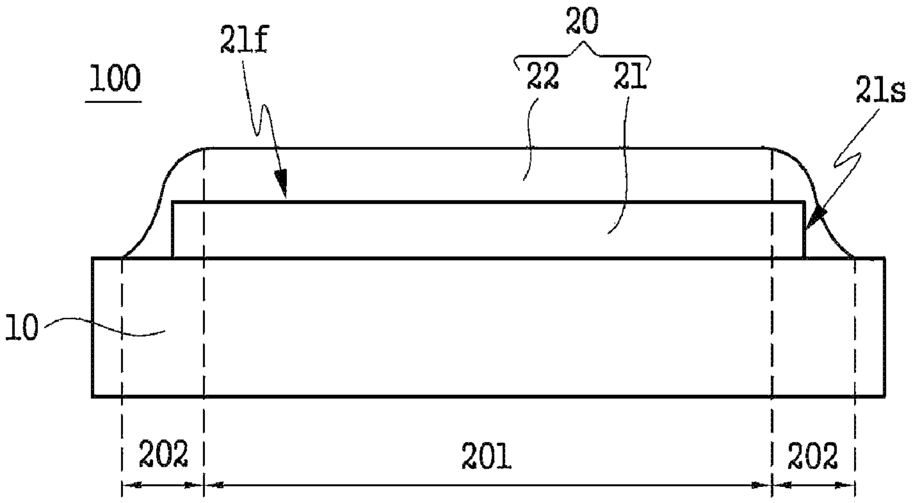

FIG. 1 is a plan view for describing a blank mask according to one or more embodiments of the present disclosure. FIGS. 2A, 2B, and 2C illustrate conceptual diagrams for describing an outer portion of a multilayer. The blank mask according to one or more embodiments will be described with reference to FIGS. 1, 2A, 2B, and 2C.

A blank mask 100 includes a light transmissive substrate 10, and a multilayer 20 disposed on the light transmissive substrate 10.

A material of the light transmissive substrate 10 is not limited as long as it has light transmissivity for exposure light and is applicable to the blank mask 100. Specifically, the transmittance of the light transmissive substrate 10 to exposure light with a wavelength of 193 nm may be equal to or greater than 85%. The transmittance may be 87% or more. The transmittance may be 99.99% or less. For example, a synthetic quartz substrate may be applied as the light transmissive substrate 10. In this case, the light-transmissive substrate 10 may suppress the attenuation of light passing through the light-transmissive substrate 10.

In addition, the occurrence of optical distortion may be suppressed by adjusting surface characteristics such as flatness and roughness of the light-transmissive substrate 10.

The multilayer 20 includes a light shielding layer 22 disposed on the light transmissive substrate 10, and a phase shift layer 21 disposed between the light transmissive substrate 10 and the light shielding layer 22, and including an upper surface facing the light shielding layer 22 and a side surface connected to the upper surface.

The phase shift layer 21 has a function of attenuating a light intensity of exposure light passing through the phase shift layer 21. In this way, it is possible to substantially suppress diffracted light generated at an edge of a transfer pattern by adjusting a phase difference of the exposure light.

The light shielding layer 22 may be positioned on an upper surface (top side) of the light transmissive substrate 10. The light shielding layer 22 may have a characteristic of blocking at least a portion of the exposure light incident on a lower surface (bottom side) of the light transmissive substrate 10. In addition, the light shielding layer 22 may be used as an etch mask in a process of patterning the phase shift layer 21.

The light shielding layer 22 is disposed on the upper surface 21*f* and a side surface 21*s* of the phase shift layer 21. The light shielding layer 22 may be disposed in contact with the upper surface 21*f* of the phase shift layer 21. The light shielding layer 22 may be disposed in contact with the side surface 21*s* of the phase shift layer 21. When another thin film (not shown) is positioned between the light shielding layer 22 and the phase shift layer 21, the light shielding layer 22 may be disposed without contacting the upper surface 21*f* and the side surface 21*s* of the phase shift layer 21. The light shielding layer with the above structure may stably protect the phase shift layer 21 from the cleaning solution in the cleaning process.

When viewed from the top surface of the multilayer 20, the multilayer 20 includes a central portion 201 and an outer portion 202 surrounding the central portion 201.

The central portion 201 is positioned at the center of the multilayer 20 and has a relatively even thickness distribution. The central portion 201 having the relatively even thickness distribution means that an absolute value of a dT value measured at each point in the central portion 201 according to the following Equation 2 is 8 nm or less.

$$dT=T1-T2 \qquad \text{[Equation 2]}$$

In Equation 2, T1 denotes a thickness of the multilayer 20 measured at a first point located on the upper surface of the multilayer 20.

T2 denotes a thickness of the multilayer 20 measured at a second point located 0.1 mm apart from the first point in a direction of one edge of the multilayer 20.

The one edge of the multilayer is located closest to the first point among edges of the multilayer.

The T1 and T2 values are measured using a surface profilometer. As an example, the T1 value and the T2 value may be measured using a surface profilometer by setting a stylus radius to 12.5 μm and a force to 3.00 mg and applying a Hills & Valleys measurement method.

The T1 value and the T2 value may be measured from the measured target blank mask 100 itself or may be measured from a sample formed by cutting the blank mask 100.

When the light transmissive substrate 10 of the blank mask 100 to be measured includes a chamfer at an edge (see FIG. 4), a portion of the multilayer 20 formed on a surface of the chamfer is excluded from the measurement target.

As an example, a Dektak 150 model of Veeco Instruments Inc. may be applied as the surface profilometer.

The outer portion 202 may be an area excluding the central portion 201 in the multilayer 20.

The outer portion 202 has a curved upper surface. The outer portion 202 having a curved upper surface means that the thickness of the multilayer 20 is varied in at least a portion of the outer portion 202 in an in-plane direction of the multilayer 20 (see FIGS. 2A to 2C).

When the curved upper surface is applied to the outer portion of the multilayer, and when an external force is applied to the multilayer during storage or movement of the blank mask, damage to the multilayer due to excessive concentration of the external force on a specific portion within the multilayer can be substantially prevented.

The light transmissive substrate 10 may include an upper surface facing the phase shift layer 21. The light shielding layer 22 may be disposed to cover at least a portion of the upper surface of the light transmissive substrate 10. Specifically, the light shielding layer 22 may cover all or a part of an area where the phase shift layer 21 is not located on the upper surface of the light transmissive substrate 10. In this case, the multilayer may have a structure in which a side surface of the phase shift layer is not exposed to the outside.

When viewed from the upper surface of the multilayer 20, an area A of the light transmissive substrate 10, an area B of the light shielding layer 22, and an area C of the phase shift layer 21 may satisfy the following Equation 1.

$$A \geq B > C \quad \text{[Equation 1]}$$

When the above Equation 1 is satisfied, the phase shift layer, which has poor cleaning resistance in the cleaning process, may be stably protected from the cleaning solution.

Figure 3A:
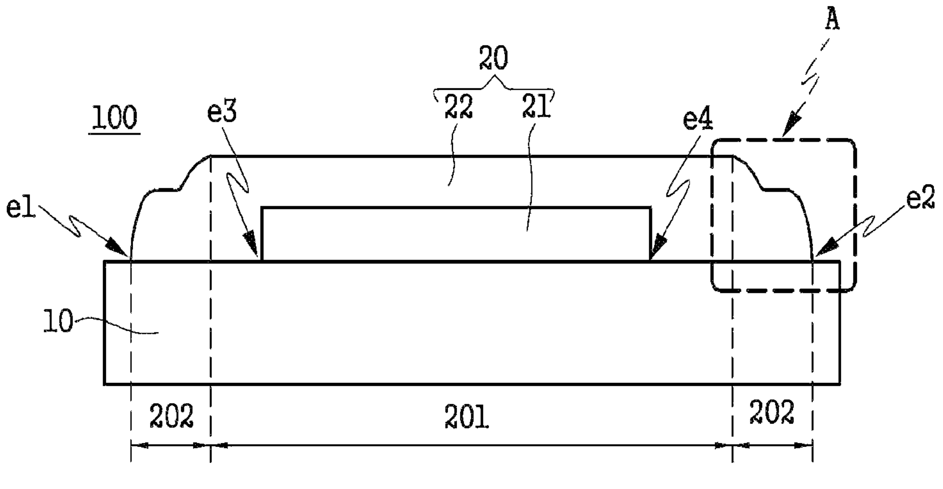
FIG. 3A illustrates a conceptual diagram for describing an edge of a lower surface of the multilayer.
Figure 3B:
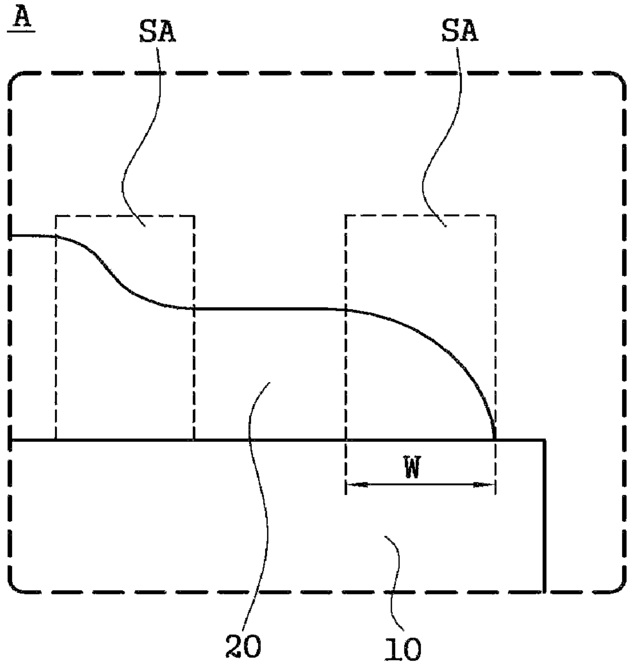
FIG. 3B is a partially enlarged view illustrating the outer portion of the multilayer of FIG. 3A.

FIG. 3A illustrates a conceptual diagram illustrating the edges of a lower surface of the multilayer, and FIG. 3B illustrates a partially enlarged view illustrating the outer portion of the multilayer of FIG. 3A. Hereinafter, a blank mask according to one or more embodiments will be described with reference to FIGS. 3A and 3B.

The outer portion 202 of the multilayer 20 may include a slope area SA in which the thickness of the multilayer 20 continuously increases from the edge of the multilayer 20 in an inward direction of the multilayer 20. In the slope area SA, the thickness of the multilayer 20 may increase irregularly and continuously from the edge of the multilayer 20 in the inward direction of the multilayer 20.

The slope area SA may be formed in at least a partial area of the outer portion 202 of the multilayer 20. The slope area SA may be formed in the entire area of the outer portion 202 of the multilayer 20. The outer portion 202 of the multilayer 20 may include one slope area SA or a plurality of slope areas SA.

The slope area SA may be disposed in the outermost portion of the multilayer 20. In a cross-sectional view of the multilayer 20, the slope area SA may have a width W ranging from 0.2 mm to 1.0 mm in the in-plane direction of the multilayer 20. The width W may be equal to or greater than 0.3 mm. The width W may be equal to or less than 0.8 mm. This may ensure that the side surfaces of the multilayer have the proper slope, which can help improve the impact resistance of the multilayer.

In an example, the width W of the slope area SA observed from the cross section of the multilayer 20 in the in-plane direction may be measured through a surface profilometer. The method of measuring the width with a surface profilometer is redundant to what is described above, so it is omitted.

The phase shift layer 21 may include a lower surface facing the light transmissive substrate 10. The multilayer 20 may include a lower surface facing the light transmissive substrate 10. The lower surface of the multilayer 20 may be a horizontally extending surface of the lower surface of the phase shift layer 21. In this case, the lower surface of the multilayer 20 may include the lower surface of the phase shift layer 21.

Referring to FIG. 3A, in a cross-sectional view of the multilayer 20, the lower surface (lower boundary) of the multilayer 20 may include a first edge e1 which is one end, and a second edge e2 which is the other end positioned opposite to the first edge e1. The lower surface (lower boundary) of the phase shift layer 21 may include a third edge e3 which is one end positioned adjacent to the first edge e1, and a fourth edge e4 which is the other end positioned adjacent to the second edge e2. The first edge e1 and the third edge e3 may be in parallel, and the second edge e2 and the fourth edge e4 may be in parallel, but the present disclosure is not limited thereto.

The smaller value of a distance value between the first edge e1 and the third edge e3 and a distance value between the second edge e2 and the fourth edge e4 may be equal to or greater than 0.1 nm. The smaller value may be equal to or greater than 0.3 nm. The smaller value may be equal to or greater than 0.5 nm. The smaller value may be equal to or greater than 1 nm. The smaller value may be equal to or greater than 1.5 nm. The smaller value may be equal to or greater than 5 nm. The smaller value may be equal to or greater than 3 nm.

In these cases, chemical damage to the side surfaces of the phase shift layer according to the cleaning process can be effectively suppressed.

A distance value between the edges observed from the cross section of the multilayer 20 is measured using a surface profilometer. Specifically, a surface profile of the multilayer 20 is measured using the surface profilometer, and the light shielding layer 22 of the multilayer 20 is etched and removed. Thereafter, the distance value between the edges is calculated by measuring the surface profile of the phase shift layer 21.

In an example, the surface profiles of the multilayer and the phase shift layers may be measured by setting a stylus radius to 12.5 μm and a force to 3.00 mg and applying a Hills & Valleys measurement method.

Among the dT values according to Equation 2 measured from the multilayer 20, a maximum value may range from 10 nm to 30 nm.

In an example, the maximum value of the dT value measured from the multilayer 20 may be controlled within a range preset in the example. This can further improve the durability of the multilayer by reducing the angle of the upper surface of the multilayer, and can simultaneously reliably protect the side surfaces of the phase shift layer on a substrate with limited area.

The maximum value of the dT value measured from the multilayer 20 may range from 10 nm to 30 nm. In these cases, the phase shift layer can be effectively protected from the cleaning liquid, and the durability of the multilayer can be further improved.

A maximum value among ddT values measured from the multilayer 20 according to the following Equation 3 may be 25 nm or less.

$$ddT = |(T1-T2)-(T2-T3)| \quad \text{[Equation 3]}$$

In Equation 3, T1 denotes a thickness of the multilayer 20 measured at a first point positioned in the multilayer 20. T2 denotes a thickness of the multilayer 20 measured at a second point located 0.1 mm apart from the first point in a direction of one edge of the multilayer 20. T3 denotes a thickness of the multilayer 20 measured at a third point located 0.1 mm apart from the second point in a direction of one edge of the multilayer 20.

In an example, the maximum value among the ddT values measured from the multilayer 20 may be controlled within a range preset in the example. In this way, the upper surface of the multilayer 20 has a relatively smooth shape, which can effectively reduce the frequency of particle generation due to damage to the multilayer 20.

The ddT value according to Equation 3 is calculated from the T1 value, T2 value, and T3 value. The T1 value, T2 value, and T3 value are measured with a surface profilometer. The methods for measuring the T1 value, T2 value, and T3 value are redundant to the methods described above, so they are omitted.

A maximum value among the ddT values measured from the multilayer 20 according to Equation 3 may be equal to or less than 30 nm. The maximum value may be equal to or greater than 1 nm. The maximum value may be equal to or greater than 5 nm. In these cases, the impact resistance of the multilayer 20 can be further improved.

Figure 4:
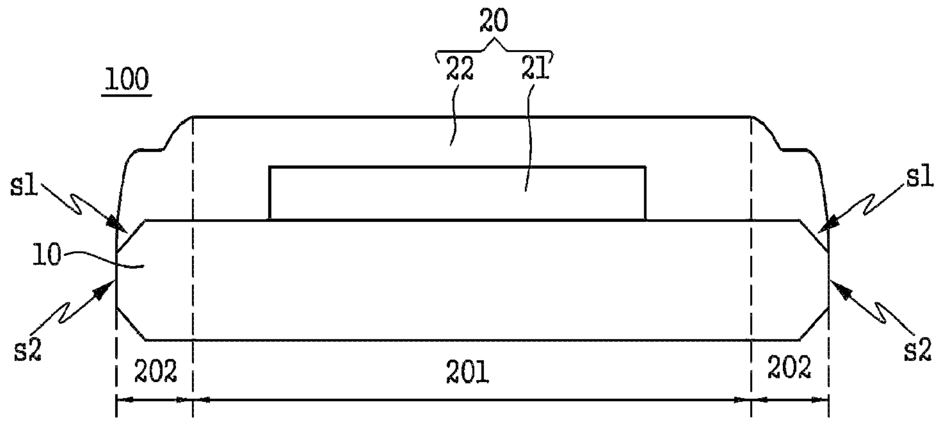
FIG. 4 illustrates a conceptual diagram for describing a blank mask according to one or more embodiments of the present disclosure.

FIG. 4 illustrates a conceptual diagram illustrating a blank mask according to one or more embodiments of the present disclosure. Hereinafter, the blank mask according to an example will be described with reference to FIG. 4.

A light transmissive substrate 10 may further include a side surface connected to an upper surface of the light transmissive substrate 10.

The side surface of the light transmissive substrate 10 may include a first surface s1 bent to extend from the upper surface of the light transmissive substrate 10, and a second surface s2 extending from the first surface s1 in a vertical direction of the blank mask 100.

A light shielding layer 22 may be provided to cover at least a portion of the first surface s1 of the light transmissive substrate 10. When the first surface s1 and the second surface s2 are simultaneously applied to the side surfaces of the light transmissive substrate 10, damage to the edges due to the impact may be suppressed.

In this example, a structure in which the light shielding layer 22 covers at least a portion of the first surface s1 of the light transmissive substrate 10 may be applied. In this way, the light shielding layer may more reliably protect the side surfaces of the phase shift layer 21.

Figure 5:
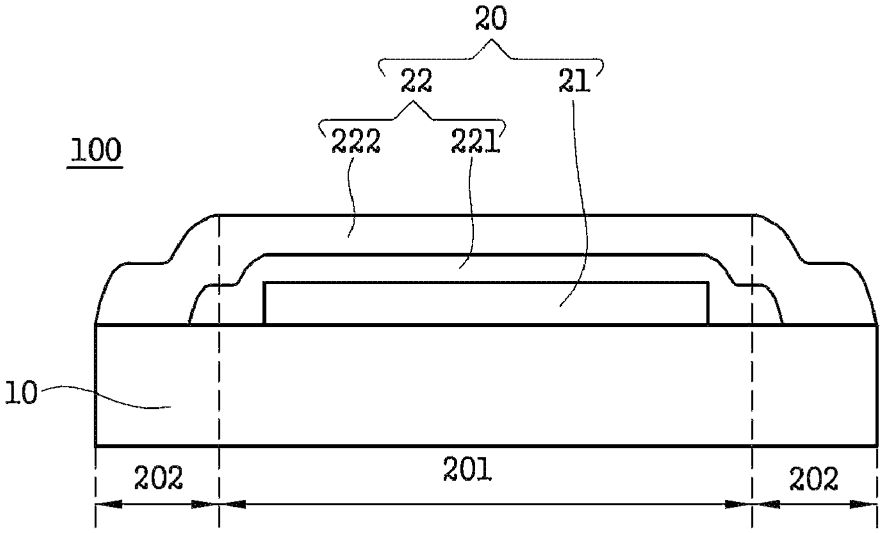
FIG. 5 illustrates a conceptual diagram for describing a blank mask according to one or more embodiments of the present disclosure.

FIG. 5 illustrates a conceptual diagram illustrating a blank mask according to one or more embodiments of the present disclosure. Hereinafter, the blank mask according to an example will be described with reference to FIG. 5.

A light shielding layer 22 may include a first light shielding layer 221 and a second light shielding layer 222 disposed on the first light shielding layer 221.

Thickness of the Multilayer

A thickness of the central portion 201 of the multilayer 20 may be equal to or greater than 80 nm. The thickness may be equal to or less than 160 nm. In these cases, the multilayer 20 may substantially suppress transmission of the exposure light.

A minimum value of the thickness of the outer portion 202 of the multilayer 20 may be equal to or greater than 0.1 nm. The minimum value may be equal to or less than 5 nm.

A thickness of the multilayer 20 measured at an edge of the multilayer 20 may be equal to or greater than 0.1 nm. The thickness may be equal to or less than 5 nm.

A thickness of the light shielding layer 22 measured at the edge of the light shielding layer 22 may be equal to or greater than 0.1 nm. The thickness may be equal to or less than 5 nm.

In these cases, the durability of the side surface and a corner of the multilayer can be further improved.

The thickness of the multilayer 20 and the thickness of the light shielding layer 22 at the edges of the light shielding layer 22 are measured with a surface profilometer. The method for measuring thickness is redundant to what is described above, so it is omitted.

The thickness of the light shielding layer 22 may range from 280 Å to 850 Å. In these cases, the light shielding layer may exhibit a stable light extinction characteristic.

A thickness of the first light shielding layer 221 may range from 250 Å to 650 Å. A thickness of the second light shielding layer 222 may range from 30 Å to 200 Å. In these cases, the light shielding layer 22 may exhibit an excellent light extinction characteristic, and a more sophisticated light shielding pattern layer may be formed.

A ratio of the thickness of the second light shielding layer 222 to the thickness of the first light shielding layer 221 may range from 0.05 to 0.3. In these cases, a shape of the side surface of the light shielding pattern layer formed through patterning may be more precisely controlled.

The thickness of the light shielding layer 22 and the thickness of each layer included in the light shielding layer 22 are measured via transmission electron microscopy (TEM). The thickness of the light shielding layer 22 and the thickness of each layer included in the light shielding layer 22 are measured in areas corresponding to the central portion 201 of the multilayer 20.

A thickness of the phase shift layer 21 may be equal to or greater than 40 nm. The thickness may be equal to or less than 100 nm. In these cases, the phase shift layer may exhibit sufficient phase shift characteristics to offset the diffracted light.

The thickness of the phase shift layer 21 is measured via TEM. The thickness of the phase shift layer 21 is measured in an area corresponding to the central portion 201 of the multilayer 20.

Composition of Each Thin Film Layer in the Multilayer

In this example, the composition of each thin film layer in the multilayer 20 may be controlled to take into account the durability, etching characteristics, etc. required for the multilayer 20.

The content of each element for each thin film layer of the light multilayer 20 may be determined by measuring its depth profile using X-ray photoelectron spectroscopy (XPS). Specifically, a sample is prepared by processing the blank mask 100 into a size of 15 mm horizontally and 15 mm vertically. Thereafter, the sample is placed in the XPS measuring equipment, and the content of each element for each layer is measured by etching an area of 4 mm horizontally and 2 mm vertically positioned in a central portion of the sample.

In an example, the content of each element for each layer may be measured with the K-alpha model from Thermo Fisher Scientific Inc.

The first light shielding layer 221 may include 25 at % or more transition metal. The first light shielding layer 221 may include 50 at % or less transition metal.

The first light shielding layer 221 may include 30 at % or more oxygen. The first light shielding layer 221 may include 55 at % or less oxygen.

The first light shielding layer 221 may include 2 at % or more nitrogen. The first light shielding layer 221 may include 25 at % or less nitrogen.

The first light shielding layer 221 may include 2 at % or more carbon. The first light shielding layer 221 may include 25 at % or less carbon.

This may help the light shielding layer 22 to have excellent light extinction characteristics and may help the first light shielding layer to have a relatively high etching speed compared to the second light shielding layer.

The second light shielding layer 222 may include 40 at % or more transition metal. The second light shielding layer 222 may include 70 at % or less transition metal.

The second light shielding layer 222 may include 5 at % or more oxygen. The second light shielding layer 222 may include 35 at % or less oxygen.

The second light shielding layer 222 may include 5 at % or more nitrogen. The second light shielding layer 222 may include 30 at % or less nitrogen.

The second light shielding layer 222 may include 1 at % or more carbon. The second light shielding layer 222 may include 25 at % or less carbon.

This may contribute to the multilayer having more improved durability and may help implement more elaborate patterning on the light shielding layer.

The transition metal may include at least one among Cr, Ta, Ti, and Hf. The transition metal may be Cr.

The phase shift layer 21 may include 1 to 10 at % transition metal.

The phase shift layer 21 may include 15 to 60 at % silicon. The phase shift layer 21 may include 25 to 50 at % silicon.

The phase shift layer 21 may include 30 to 60 at % nitrogen. The phase shift layer 21 may include 35 to 55 at % nitrogen.

The phase shift layer 21 may include 5 to 35 at % oxygen. The phase shift layer 21 may include 10 to 25 at % oxygen.

In these cases, the phase shift layer 21 may have optical characteristics suitable for a lithography process using short-wavelength exposure light, specifically, light with a wavelength of 200 nm or less.

The transition metal applied to the phase shift layer 21 may include at least one among molybdenum, Ta, and zirconium. The transition metal may be molybdenum.

The phase shift layer 21 may additionally include other elements in addition to the above-described elements. As an example, the phase shift layer 21 may include argon or helium.

Optical Characteristics of the Multilayer

An optical density of the multilayer 20 with respect to light with a wavelength of 193 nm may be 2.5 or more. The optical density may be 5.0 or less.

The optical density of the light shielding layer 22 with respect to the light with a wavelength of 193 nm may be 1.3 or more.

The transmittance of the light shielding layer 22 for light with a wavelength of 193 nm may be 2% or less.

In these cases, the light shielding layer may help to effectively block the transmission of exposure light.

The phase difference of the phase shift layer 21 for light with a wavelength of 193 nm may range from 170° to 190°.

The transmittance of the phase shift layer 21 for light with a wavelength of 193 nm may range from 3% to 10%.

In these cases, it is possible to effectively suppress diffracted light which may occur at an edge of the pattern layer.

The optical densities, transmittance, and phase differences for the multilayer and each thin film layer included in the multilayer are measured using a spectroscopic ellipsometer. For example, optical density may be measured using the MG-Pro model from NanoView Co., Ltd.

Other Thin Film Layers

A hard mask (not shown) may be disposed on the light shielding layer 22. The hard mask may serve as an etching mask during etching of the pattern of the light shielding layer 22. The hard mask may include silicon, nitrogen, and oxygen.

A resist layer (not shown) may be positioned on the light shielding layer 22. The resist layer may be formed in contact with the upper surface of the light shielding layer 22. The resist layer may be formed in contact with an upper surface of another thin film layer disposed on the light shielding layer 22.

The resist layer may form a resist pattern layer through electron beam irradiation and development. The resist pattern layer may serve as an etching mask during etching of the pattern of the light shielding layer 22.

A positive resist may be applied as the resist layer. A negative resist may be applied as the resist layer. For example, an FEP255 model from Fuji Co., Ltd. may be employed as the resist layer.

A Photomask Made from a Blank Mask

A photomask according to one or more embodiments of the present disclosure may be implemented from the blank mask.

The description of the blank mask is redundant to what is described above, so it is omitted.

Method of Manufacturing a Blank Mask

A method of manufacturing a blank mask according to one or more embodiments of the present disclosure includes a multilayer forming operation of forming a multilayer on a light transmissive substrate. The multilayer forming operation may include a phase shift layer forming operation of forming a phase shift layer on the light transmissive substrate, and a light shielding layer forming operation of forming a light shielding layer on the phase shift layer.

In the phase shift layer forming operation, sputtering may be performed using a sputtering chamber in which the light transmissive substrate and a sputtering target are disposed. In this way, the phase shift layer may be formed on the light transmissive substrate.

The description of the light transmissive substrate is redundant to what is described above, so it is omitted.

In the phase shift layer forming operation, the sputtering target may be applied by considering the composition of the phase shift layer to be formed.

In the phase shift layer forming operation, one sputtering target containing both a transition metal and silicon may be applied. In the phase shift layer forming operation, two or more sputtering targets including a sputtering target containing a transition metal and a sputtering target containing silicon may be applied.

When one sputtering target is applied in the phase shift layer forming operation, a transition metal content of the sputtering target may be 30 at % or less. The transition metal content may be 20 at % or less. The transition metal content may be 2 at % or more.

The silicon content of the sputtering target may be 70 at % or higher. The silicon content may be 80 at % or more. The silicon content may be 98 at % or less.

In the phase shift layer forming operation, atmospheric gas may be injected into the sputtering chamber. The atmospheric gas may include inert and reactive gas. The inert gas is a gas not containing the elements that make up the formed thin film layer. The reactive gas is a gas that contains elements that make up the formed thin film layer.

The inert gas may include a gas which is ionized in a plasma atmosphere and collides with the sputtering target. The inert gas may include argon. The inert gas may further include helium for the purpose of stress control of a thin film layer to be formed.

The atmospheric gas may include 2 vol % or more argon. The atmospheric gas may include 5 vol % or more argon. The atmospheric gas may include 30 vol % or less argon. The atmospheric gas may include 20 vol % or less argon.

The atmospheric gas may include 20 vol % or more helium. The atmospheric gas may include 25 vol % or more helium. The atmospheric gas may include 30 vol % or more helium. The atmospheric gas may include 60 vol % or less helium. The atmospheric gas may include 55 vol % or less helium. The atmospheric gas may include 50 vol % or less helium.

The reactive gas may include a gas containing the element nitrogen.

Examples of the gas containing the element nitrogen may include $N_2$, NO, $NO_2$, $N_2O$, $N_2O_3$, $N_2O_4$, and $N_2O_5$ gases. The reactive gas may include a gas containing the element oxygen. Examples of the gas containing the element oxygen may include $O_2$ and $CO_2$ gases. The reactive gas may include a gas containing the element nitrogen and a gas containing the element oxygen. The reactive gas may include a gas containing both the element nitrogen and the element oxygen. Examples of the gas containing both the element nitrogen and the element oxygen may include NO, $NO_2$, $N_2O$, $N_2O_3$, $N_2O_4$, and $N_2O_5$ gases.

The atmospheric gas may include 20 vol % or more reactive gas. The atmospheric gas may include 30 vol % or more reactive gas. The atmospheric gas may include 40 vol % or more reactive gas. The atmospheric gas may include 80 vol % or less reactive gas.

In the phase shift layer forming operation, a T/S distance, which is a distance between a target and a substrate, may range from 240 mm to 260 mm. An angle between the substrate and the target may range from 20° to 30°. A rotation speed of the substrate may range from 2 revolutions per minute (RPM) to 20 RPM.

In the phase shift layer forming operation, sputtering may be performed by applying power to the sputtering target. A power source for applying power to the sputtering target may be a DC power source or a radio frequency (RF) power source.

The power applied to the sputtering target may range from 1 kW to 3 kW. The power may range from 1.5 kW to 2.5 kW. The power may range from 1.8 kW to 2.2 kW.

In the phase shift layer forming operation, sputtering may be performed for 600 seconds or more, and 800 seconds or less.

When the phase shift layer is formed, a mask shield may be disposed on the light transmissive substrate. The mask shield may include an opening and a shield portion surrounding the opening. In this case, while the sputtering is being performed, the mask shield may pass sputtering particles toward the opening and prevent the particles sputtering toward the shield portion from being deposited on the substrate. In this way, the shape and area of the phase shift layer formed can be controlled.

A ratio of an area of the opening of the mask shield to an area of an upper surface of the substrate, which is a deposition target, may be 0.98 or less. The ratio may be 0.95 or less. The ratio may be 0.93 or less. The ratio may be 0.5 or more.

The opening of the mask shield may have a square shape. A ratio of a length of one side of the opening of the mask shield to a length of one side of the substrate, which is a deposition target, may be 0.98 or less. The ratio may be 0.7 or more. The ratio may be 0.8 or more.

In the phase shift layer forming operation, the mask shield may be disposed 0.5 mm or more apart from the upper surface of the substrate which is a deposition target. The mask shield may be disposed 1 mm or more apart from the upper surface of the substrate which is a deposition target. The mask shield may be disposed 5 mm or less apart from the upper surface of the substrate which is a deposition target.

In these cases, the shape and area of the phase shift layer may be controlled to easily protect a side surface of the phase shift layer through the formation of the light shielding layer.

The material of the mask shield is not limited as long as it is applicable to the sputtering field. For example, the material of the mask shield may be an aluminum alloy.

The formed phase shift layer may be heat-treated in order to relieve internal stresses and improve light resistance.

The method of manufacturing a blank mask includes a light shielding layer forming operation of forming a light shielding layer on the phase shift layer.

The sputtering target applied to the light shielding layer forming operation may include 90 wt % or more of at least one of Cr, Ta, Ti, and Hf. The sputtering target may include 95 wt % or more of at least one of Cr, Ta, Ti, and Hf. The sputtering target may include 99 wt % or more of at least one of Cr, Ta, Ti, and Hf.

The sputtering target applied in the light shielding layer forming operation may include 90 wt % or more Cr. The sputtering target may include 95 wt % or more Cr. The sputtering target may include 99 wt % or more Cr. The sputtering target may include 100 wt % or less Cr.

The light shielding layer forming operation may include a first light shielding layer forming operation and a second light shielding layer forming operation. In the light shielding layer forming operation, a sputtering process condition may be differently applied to each layer included in the light shielding layer. In particular, taking into account the light extinction and etching characteristics required for the layers, different process conditions such as the composition of the atmospheric gas, the power applied to the sputtering target, and the formation time may be applied to the layers.

The atmospheric gas may include inert and reactive gases.

The inert gas may include a gas which is ionized in a plasma atmosphere and collides with the sputtering target. The inert gas may include argon. The inert gas may further include helium for the purpose of stress control of a thin film layer to be formed.

The reactive gas may include gases containing the element nitrogen.

Examples of the gases containing the element nitrogen may include $N_2$, NO, $NO_2$, $N_2O$, $N_2O_3$, $N_2O_4$, and $N_2O_5$ gases. The reactive gas may include gases containing the element oxygen. Examples of the gases containing the element oxygen may include $O_2$ and $CO_2$ gases. The reactive gas may include gases containing the element nitrogen and gases containing the element oxygen. The reactive gas may include gases containing both the element nitrogen and the element oxygen. Examples of the gases containing both the element nitrogen and the element oxygen may include NO, $NO_2$, $N_2O$, $N_2O_3$, $N_2O_4$, and $N_2O_5$ gases.

When the light shielding layer is formed in the light shielding layer forming operation, a mask shield may be disposed on the phase shift layer.

A ratio of an area of an opening of the mask shield applied in the light shielding layer forming operation to the area of the opening of the mask shield applied in the phase shift layer forming operation may be 1.01 or more. The ratio may be 1.02 or more. The ratio may be 1.03 or more. The ratio may be 5 or less.

The openings of the mask shields applied in the phase shift layer forming operation and the light shielding layer forming operation may each have a square shape. A ratio of a length of one side of the opening of the mask shield applied in the light shielding layer forming operation to the length of one side of the opening of the mask shield applied in the phase shift layer forming operation may be 1.005 or more. The ratio may be 1.01 or more. The ratio may be 2.3 or less.

In the light shielding layer forming operation, the mask shield may be disposed 0.5 mm or more apart from the upper surface of the substrate which is a deposition target. The mask shield may be disposed 1 mm or more apart from the upper surface of the substrate which is a deposition target. The mask shield may be disposed 5 mm or less apart from the upper surface of the substrate which is a deposition target.

In these cases, it is possible to stably protect the phase shift layer from a cleaning solution and form a multilayer with a reduced frequency of particle generation.

The material of the mask shield is not limited as long as it is applicable in the sputtering field. For example, the material of the mask shield may be an aluminum alloy.

In the first light shielding layer forming operation, power applied to the sputtering target may be 1.5 kW or more and 2.5 kW or less. The power applied to the sputtering target may be 1.6 kW or more and 2 kW or less.

In the first light shielding layer forming operation, a ratio of a flow rate of the reactive gas to a flow rate of the inert gas in the atmospheric gas may be 0.5 or more. The flow rate ratio may be 1.5 or less. The flow rate ratio may be 1.2 or less. The flow rate ratio may be 1 or less.

In the atmosphere gas, a ratio of a flow rate of Ar gas to the total flow rate of the inert gas may be 0.2 or more. The flow rate ratio may be 0.55 or less.

In the atmospheric gas, a ratio of an oxygen content to a nitrogen content included in the reactive gas may be 1.5 or more and 4 or less. The ratio may be 2 or more and 3.5 or less.

In these cases, the formed first light shielding layer may help the light shielding layer to have sufficient light extinction characteristics. In addition, the formed first light shielding layer may help to precisely control a shape of the light blocking pattern layer during the light shielding layer patterning operation.

The first light shielding layer forming operation may be performed for a time of 200 seconds or more and 300 seconds or less. The first light shielding layer forming operation may be performed for a time of 230 seconds or more and 280 seconds or less. In these cases, the formed first light shielding layer may help the light shielding layer to have sufficient light extinction characteristics.

In the second light shielding layer forming operation, power applied to the sputtering target may range from 1 kW to 2 kW. The power may range from 1.2 kW to 1.7 kW. In these cases, impact resistance of the second light shielding layer can be further improved, and thus the second light shielding layer can help the light shielding layer to have desired optical characteristics and etching characteristics.

In the second light shielding layer forming operation, a ratio of a flow rate of the reactive gas to a flow rate of the inert gas, which are included in the atmospheric gas, may be 0.4 or more. The flow rate ratio may be 1 or less.

In the atmosphere gas, a ratio of a flow rate of Ar gas to the total flow rate of the inert gas may be 0.8 or more. The flow rate ratio may be 1 or less.

In the second light shielding layer forming operation, a ratio of an oxygen content to a nitrogen content, which are included in the reactive gas, may be 0.3 or less. The ratio may be 0.1 or less. The ratio may be 0.001 or more. The ratio may be 0 or more.

In these cases, a surface of the light shielding layer may have stable durability and excellent light extinction characteristics.

The second light shielding layer forming operation may be performed for a time of 10 seconds or more and 30 seconds or less. The second light shielding layer forming operation may be performed for a time of 15 seconds or more and 25 seconds or less. In these cases, a light shielding layer with excellent durability may be formed, and light shielding layer patterning may be more elaborately implemented.

Heat treatment may be performed on the multilayer to relieve internal stress of the light shielding layer.

Method of Manufacturing Semiconductor Device

A method of manufacturing a semiconductor device according to one or more embodiments of the present disclosure includes a preparation operation of preparing a light source, a photomask, and a semiconductor wafer on which a resist layer is applied, an exposure operation of selectively transmitting and emitting light incident from the light source through the photomask to the semiconductor wafer, and a development operation of developing a resist pattern on the semiconductor wafer.

The photomask is implemented from the blank mask.

In the preparation operation, the light source is a device capable of generating exposure light with a short wavelength. The exposure light may be light with a wavelength of 200 nm or less. The exposure light may be ArF light with a 193 nm wavelength.

A lens may be additionally disposed between the photomask and the semiconductor wafer. The lens has a function of reducing a circuit pattern shape on the photomask and transferring the reduced circuit pattern shape onto the semiconductor wafer. The lens is not limited as long as it can be generally applied in an ArF semiconductor wafer exposure process. For example, a lens made of calcium fluoride ($CaF_2$) may be employed as the lens.

In the exposure operation, the exposure light may be selectively transmitted onto the semiconductor wafer through the photomask. In this case, chemical degeneration may occur in a portion of the resist layer on which the exposure light is incident.

In the development operation, a resist pattern may be developed on the semiconductor wafer by treating the semiconductor wafer, which has undergone the exposure operation, with a developer. When the applied resist layer is a positive resist, the portion of the resist layer on which the exposure light is incident may be dissolved by the developer. When the applied resist layer is a negative resist, a portion of the resist layer on which the exposure light is not incident may be dissolved by the developer. The resist layer is formed into a resist pattern by the developer treatment. A pattern may be formed on the semiconductor wafer using the resist pattern as a mask.

The description of the photomask is redundant to what is described above and is therefore omitted.

Hereinafter, specific examples will be described in more detail.

Manufacturing Examples: Formation of Light Shielding Layer

Example 1: A light transmissive substrate made of quartz with 6 inches horizontally, 6 inches vertically, a thickness of 0.25 inches, and a flatness of less than 500 nm was disposed in a chamber of a DC sputtering device. A chamfer with a 0.45 mm width was applied to an edge of the light transmissive substrate. A sputtering target was disposed in the chamber so that a T/S distance was 255 mm and an angle between the substrate and the target was 25 degrees. The sputtering target contained molybdenum at 10 at % and silicon at 90 at %.

An aluminum alloy mask shield with an opening of 149.4 mm horizontally and 149.4 mm vertically was disposed on the light transmissive substrate. The mask shield was disposed at a position 2 mm apart from the upper surface of the light transmissive substrate.

Thereafter, an atmospheric gas mixed at a ratio of $Ar:N_2:He=9:52:39$ was introduced into the chamber, sputtering power was set to 2 kW, and the formation of the phase shift layer was performed for a time of 600 seconds or more and 800 seconds or less.

The phase shift layer after the formation was annealed at 1 Pa and a temperature of 400° C. for 30 minutes and then cooled naturally.

Example 2: A phase shift layer was formed on the light transmissive substrate under the same conditions as in Example 1. A first light shielding layer was formed on the phase shift layer. When the first light shielding layer was formed, a chromium target was applied as the sputtering target, and the same T/S distance and angle between the substrate and the target as in the case of the formation of the phase shift layer were applied.

When the first light shielding layer was formed, an aluminum alloy mask shield with an opening of 151.4 mm horizontally and 151.4 mm vertically was disposed on the phase shift layer. The mask shield was disposed at a position 2 mm apart from an upper surface of the phase shift layer.

In the first light shielding layer forming operation, an atmospheric gas, in which 19 vol % Ar, 11 vol % $N_2$, 36 vol % $CO_2$, and 34 vol % He were mixed, was introduced into the chamber, and the first light shielding layer was formed by performing a sputtering process for 250 seconds by applying power of 1.85 kW to the sputtering target.

After the formation of the first light shielding layer was completed, atmosphere gas mixed with 57 vol % Ar and 43 vol % $N_2$ was introduced onto the first light shielding layer in the chamber, and a second light shielding layer was formed by performing a sputtering process for 25 seconds by applying 1.5 kW of power to the sputtering target. When forming the second light shielding layer, the same mask shield arrangement conditions were applied as when forming the first light shielding layer.

Once the second light shielding layer was formed, the blank mask was placed in the heat treatment chamber, which was then subjected to an ambient temperature of 250° C. for 15 minutes.

Comparative Example 1: A blank mask was manufactured in the same manner as in Example 2, except that a mask shield was not applied when a phase shift layer and a light shielding layer were formed.

Evaluation Example: Measurement of Surface Profiles of Phase Shift Layers and Multilayer Surface profiles of the phase shift layer of Example 1 and the multilayer of Example 2 were measured. Specifically, a point 0.5 mm apart from the edge of the mask for each sample in an inward direction of the mask was set as a measurement starting point. A surface profile of the thin film layer (that is, a thickness of the thin film layer at each position) was measured at intervals of 0.1 mm in a section from the starting point to a point which was 4 mm apart in the inward direction of the mask. The surface profile was measured with a Dektak 150 model surface profilometer of Veeco Instruments Inc. During the measurement, a stylus radius was set to 12.5 μm, a force was set to 3.00 mg, and a Hills & Valleys measurement method was applied.

Figure 6:
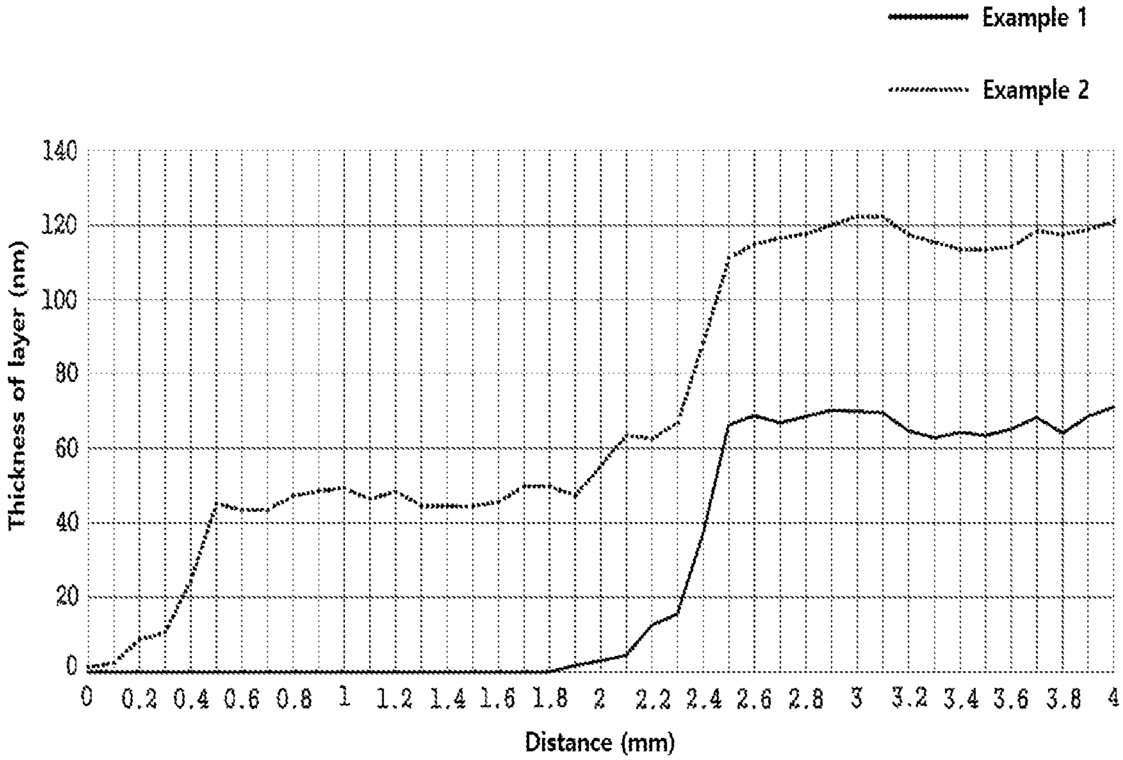
FIG. 6 illustrates a graph showing surface profiles of a light shielding layer of Example 1 and a multilayer of Example 2.

A thickness of the phase shift layer for each position of the phase shift layer in Example 1 and a thickness, a dT value, and a ddT value for each position of the multilayer in Example 2 are shown in the following Table 1, and a maximum value of the dT value and a maximum value of the ddT value in Example 2 are shown in the following Table 2. A graph showing the surface profiles measured in Examples 1 and 2 is shown in FIG. 6.

Evaluation Example: Evaluation of Degree of Damage to Phase Shift Layer According to Cleaning Process The blank masks of Example 2 and Comparative Example 1 were immersed in a standard clean-1 (SC-1) solution for 800 seconds and cleaned using ozone water. A solution including 14.3 wt % $NH_4OH$, 14.3 wt % $H_2O_2$, and 71.4 wt % $H_2O$ was applied as the SC-1 solution.

Then, a cross section of the mask was observed through the TEM. When damage to the phase shift layer was not observed in the cross-sectional image of the blank mask, it was evaluated as P, and when damage to the phase shift layer was observed, it was evaluated as F.

The measured results for each example and the comparative example are shown in Table 3 below.

Evaluation Example: Particle Evaluation

The number of observed particles was measured by measuring the image of the upper surface of the multilayer of each example and the comparative example. Specifically, a sample for each example and the comparative example was disposed in a M6641S model defect inspection system of Lasertec Corporation. Then, the number of particles was measured in an area of 146 mm horizontally and 146 mm vertically in the upper surface of the multilayer. When the number of particles was measured, inspection light was a green laser with a 532 nm wavelength, laser power was 3000 mW (a laser output was 1050 mW measured on a surface of a substrate to be measured), and a stage movement speed was set to 2.

Thereafter, the samples for each example and the comparative example were stored in a standard mechanical interface (SMIF) pod for one week, and then opened inside the defect inspection system. In addition, the number of particles on the upper surface of the multilayer was measured under the same conditions as when the number of particles was measured before being stored in the SMIF pod.

Each sample was compared to the sample before storage in the SMIF pod and evaluated as F when an increase in the number of particles detected in the sample was observed after storage in the SMIF pod, and as P when no increase in the number of particles was observed.

The measured results for each example and the comparative example are shown in the following Table 3.

TABLE 1

| Measurement position (distance between starting point of measurement section and measurement point (mm)) | Example 1 Thickness of phase shift layer (nm) | Example 2 Thickness of multilayer (nm) | Example 2 dT (nm) | Example 2 ddT (nm) |
|---|---|---|---|---|
| 0 | 0 | 1.95 | 0 | 0 |
| 0.1 | 0 | 2.91 | 0.96 | 0 |
| 0.2 | 0 | 8.38 | 5.47 | 4.51 |
| 0.3 | 0 | 10.68 | 2.30 | 3.17 |
| 0.4 | 0 | 24.71 | 14.03 | 11.74 |
| 0.5 | 0 | 44.82 | 20.11 | 6.07 |
| 0.6 | 0 | 43.82 | −1.00 | 21.11 |
| 0.7 | 0 | 44.36 | 0.54 | 1.54 |
| 0.8 | 0 | 47.04 | 2.68 | 2.15 |
| 0.9 | 0 | 48.83 | 1.78 | 0.90 |
| 1 | 0 | 49.40 | 0.58 | 1.20 |
| 1.1 | 0 | 46.49 | −2.91 | 3.49 |
| 1.2 | 0 | 48.34 | 1.85 | 4.76 |
| 1.3 | 0 | 44.80 | −3.55 | 5.40 |
| 1.4 | 0 | 44.60 | −0.20 | 3.35 |
| 1.5 | 0 | 44.73 | 0.13 | 0.32 |
| 1.6 | 0 | 45.76 | 1.03 | 0.90 |
| 1.7 | 0 | 49.84 | 4.08 | 3.05 |
| 1.8 | 0 | 49.71 | −0.13 | 4.21 |
| 1.9 | 1.66 | 47.57 | −2.14 | 2.01 |
| 2 | 2.89 | 55.63 | 8.06 | 10.20 |
| 2.1 | 4.32 | 63.31 | 7.68 | 0.38 |
| 2.2 | 12.44 | 62.85 | −0.46 | 8.14 |
| 2.3 | 15.85 | 66.65 | 3.80 | 4.26 |
| 2.4 | 36.69 | 87.29 | 20.64 | 16.84 |
| 2.5 | 66.54 | 111.27 | 23.98 | 3.34 |
| 2.6 | 69.22 | 114.98 | 3.71 | 20.27 |
| 2.7 | 67.11 | 116.95 | 1.97 | 1.74 |
| 2.8 | 68.49 | 118.20 | 1.25 | 0.72 |
| 2.9 | 70.18 | 120.22 | 2.02 | 0.77 |
| 3 | 69.73 | 122.28 | 2.06 | 0.04 |
| 3.1 | 69.59 | 122.30 | 0.02 | 2.04 |
| 3.2 | 65.38 | 117.19 | −5.11 | 5.13 |
| 3.3 | 62.83 | 115.13 | −2.06 | 3.05 |
| 3.4 | 64.21 | 113.74 | −1.39 | 0.67 |
| 3.5 | 63.46 | 113.74 | 0.00 | 1.39 |
| 3.6 | 65.00 | 114.74 | 1.00 | 1.00 |
| 3.7 | 68.39 | 118.14 | 3.40 | 2.40 |
| 3.8 | 63.92 | 117.48 | −0.66 | 4.06 |
| 3.9 | 68.51 | 119.27 | 1.79 | 2.45 |
| 4 | 71.03 | 121.02 | 1.75 | 0.04 |

TABLE 2

| | Maximum value of dT value (nm) | Maximum value of ddT value (nm) |
|---|---|---|
| Example 2 | 23.98 | 21.11 |

TABLE 3

| | Evaluate whether phase shift layer is damaged | Particle evaluation |
|---|---|---|
| Example 2 | P | P |
| Comparative Example 1 | F | F |

In Table 3, Example 2 was evaluated as P in both the phase shift layer damage evaluation and the particle evaluation, while the Comparative Example 1 was evaluated as F in both the phase shift layer damage evaluation and the particle evaluation.

According to the blank mask according to one or more embodiments, the damage of the phase shift layer by the cleaning solution can be significantly suppressed, and the frequency of particle generation derived from the phase shift layer and the light shielding layer can be effectively reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A blank mask, comprising:

a light transmissive substrate; and a multilayer comprising a light shielding layer and a phase shift layer disposed between the light transmissive substrate and the light shielding layer, wherein the phase shift layer comprises an upper surface facing the light shielding layer and a side surface connected to the upper surface, such that the light shielding layer continuously covers the upper surface and the side surface of the phase shift layer such that the side surface of the phase shift layer is not exposed, wherein when viewed from a top surface of the multilayer, the multilayer comprises a central portion and an outer portion surrounding the central portion, and wherein the outer portion has a curved upper surface.

2. The blank mask of claim 1, wherein the light transmissive substrate includes an upper surface facing the phase shift layer; and wherein the light shielding layer is disposed on at least a portion of the upper surface of the light transmissive substrate.

3. The blank mask of claim 2, wherein the light transmissive substrate further comprises a side surface connected to the upper surface of the light transmissive substrate;

wherein the side surface of the light transmissive substrate comprises a first surface bent to extend from the upper surface of the light transmissive substrate, and a second surface extending from the first surface in a vertical direction of the blank mask; and wherein the light shielding layer is disposed on at least a portion of the first surface of the light transmissive substrate.

4. The blank mask of claim 1, wherein, when viewed from the top surface of the multilayer, an area A of the light transmissive substrate, an area B of the light shielding layer, and an area C of the phase shift layer satisfy the following Equation 1:

$$A \geq B > C \quad \text{[Equation 1].}$$

5. The blank mask of claim 1, wherein the outer portion of the multilayer comprises a slope area in which a thickness of the multilayer increases from an edge of the multilayer in an inward direction of the multilayer.

6. The blank mask of claim 5, wherein the slope area is disposed at an outermost portion of the multilayer; and wherein in a cross-sectional view of the multilayer, the slope area has a width ranging from 0.2 mm to 1.0 mm in an in-plane direction of the multilayer.

7. The blank mask of claim 5, wherein, among dT values according to Equation 2 measured from the multilayer, a maximum value ranges from 10 nm to 30 nm:

$$dT = T1 - T2, \text{ and} \quad \text{[Equation 2]}$$

in Equation 2, [Equation 2]T1 denotes a thickness of the multilayer measured at a first point located in the multilayer, and T2 denotes a thickness of the multilayer measured at a second point located 0.1 mm apart from the first point in a direction of one edge of the multilayer.

8. The blank mask of claim 1, wherein, among ddT values according to Equation 3 measured from the multilayer, a maximum value is 30 nm or less:

$$ddT = |(T1 - T2) - (T2 - T3)|, \text{ and} \quad \text{[Equation 3]}$$

in Equation 3, T1 denotes a thickness of the multilayer measured at a first point located in the multilayer, T2 denotes a thickness of the multilayer measured at a second point located 0.1 mm apart from the first point in a direction of one edge of the multilayer, and T3 denotes a thickness of the multilayer measured at a third point located 0.1 mm apart from the second point in the direction of the one edge of the multilayer.

9. The blank mask of claim 1, wherein the multilayer includes a lower surface in contact with the light transmissive substrate;

wherein the phase shift layer comprises a lower surface in contact with the light transmissive substrate;

wherein in a cross-sectional view of the multilayer, the lower surface of the multilayer comprises a first edge which is one end and a second edge which is the other end opposite to the first edge, and the lower surface of the phase shift layer comprises a third edge which is one end positioned adjacent to the first edge, and a fourth edge which is the other end positioned adjacent to the second edge; and wherein a smaller value of a distance value between the first edge and the third edge and a distance value between the second edge and the fourth edge is 0.1 nm or more.

10. A photomask made from a blank mask, the blank mask comprising:

a light transmissive substrate; and a multilayer comprising a light shielding layer and a phase shift layer that is disposed between the light transmissive substrate and the light shielding layer, wherein the phase shift layer comprises an upper surface facing the light shielding layer and a side surface connected to the upper surface, such that the light shielding layer continuously covers the upper surface and the side surface of the phase shift layer such that the side surface of the phase shift layer is not exposed, wherein when viewed from a top surface of the multilayer, the multilayer comprises a central portion and an outer portion surrounding the central portion, and wherein the outer portion has a curved upper surface.

11. A method of manufacturing a semiconductor device, the method comprising:

preparing a light source, a photomask, and a semiconductor wafer on which a resist layer is applied;

selectively transmitting and emitting a light incident from the light source through the photomask to the semiconductor wafer; and developing a photoresist pattern formed on the semiconductor wafer, wherein the photomask is made from the blank mask according to claim 1.

* * * * *